United States Patent
Che et al.

(10) Patent No.: US 9,625,487 B2
(45) Date of Patent: Apr. 18, 2017

(54) CAPACITIVE ACCELERATION SENSOR WITH A BENDING ELASTIC BEAM AND PREPARATION METHOD THEREOF

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Lufeng Che, Shanghai (CN); Xiaofeng Zhou, Shanghai (CN); Yuelin Wang, Shanghai (CN)

(73) Assignee: SHANGHAI INSTITUTE OF MICROSYSTEM AND INFORMATION TECHNOLOGY, CHINESE ACADEMY OF SCIENCES, Changning District, Shanghai (CN)

( * ) Notice: Subject to any disclaimer, the term of this patent is extended or adjusted under 35 U.S.C. 154(b) by 215 days.

(21) Appl. No.: 14/387,364

(22) PCT Filed: Dec. 4, 2012

(86) PCT No.: PCT/CN2012/085811
§ 371 (c)(1),
(2) Date: Sep. 23, 2014

(87) PCT Pub. No.: WO2014/063410
PCT Pub. Date: May 1, 2014

(65) Prior Publication Data
US 2015/0075283 A1 Mar. 19, 2015

(30) Foreign Application Priority Data
Oct. 26, 2012 (CN) .......................... 2012 1 0418835

(51) Int. Cl.
*G01P 15/125* (2006.01)
*B81C 1/00* (2006.01)
*G01P 15/08* (2006.01)

(52) U.S. Cl.
CPC ........ *G01P 15/125* (2013.01); *B81C 1/00341* (2013.01); *B81C 1/00531* (2013.01); *G01P 2015/0871* (2013.01); *G01P 2015/0882* (2013.01)

(58) Field of Classification Search
CPC ............ B81C 1/00341; B81C 1/00531; B81C 1/00134; G01P 15/125; G01P 2015/0871; G01P 2015/0882; B81B 3/0021
See application file for complete search history.

(56) References Cited

U.S. PATENT DOCUMENTS 5,987,989 A * 11/1999 Yamamoto ............ B81B 7/0006
361/280
6,035,714 A * 3/2000 Yazdi .................. G01P 15/0802
73/514.32

(Continued)

FOREIGN PATENT DOCUMENTS

CN 102495234 A * 6/2012

OTHER PUBLICATIONS

Google Patents, Yuelin, Capacitive type micro-acceleration sensor with double sided symmetrical elastic beam structure and manufacturing method, Pubication Date Jun. 3, 2012.*

*Primary Examiner* — Francis Gray
(74) *Attorney, Agent, or Firm* — Global IP Services; Tianhua Gu

(57) ABSTRACT

The present invention provides a capacitive acceleration sensor with a bending elastic beam and a preparation method. The sensor at least includes a first electrode structural layer, a middle structural layer and a second electrode structural layer; wherein the first electrode structural layer (Continued)

and the second electrode structural layer are provided with an electrode lead via-hole, respectively; the middle structural layer includes: a frame formed on a SOI silicon substrate with a double device layers, a seismic mass whose double sides are symmetrical and a bending elastic beam with one end connected to the frame and the other end connected to the seismic mass, wherein anti-overloading bumps and damping grooves are symmetrically provided on two sides of the seismic mass, and the bending elastic beams at different planes are staggered distributed and are not overlapped with each other in space. Since the bending times, the total length and the total width of the bending elastic beam can be prepared as needed, capacitive acceleration sensors with different sensitivities can be manufactured according to the present invention, and the manufacturing has high flexibility.

10 Claims, 9 Drawing Sheets

(56) References Cited

U.S. PATENT DOCUMENTS

| | | | | |
|---|---|---|---|---|
| 6,149,190 | A * | 11/2000 | Galvin | B81C 1/00619 |
| | | | | 280/735 |
| 6,170,332 | B1 * | 1/2001 | MacDonald | B81C 1/00619 |
| | | | | 73/514.32 |
| 2007/0007607 | A1 * | 1/2007 | Sakai | B81B 7/007 |
| | | | | 257/414 |

* cited by examiner

CAPACITIVE ACCELERATION SENSOR WITH A BENDING ELASTIC BEAM AND PREPARATION METHOD THEREOF

CROSS REFERENCE TO RELATED PATENT APPLICATION

The present application is the US national stage of PCT/CN2012/085811 filed on Dec. 4, 2012, which claims the priorities of the Chinese patent applications No. 201210418835.X filed on Oct. 26, 2012, which applications are incorporated herein by reference.

BACKGROUND OF THE PRESENT INVENTION

Field of Invention

The present invention relates to a field of micro-electro-mechanical systems (MEMS), and in particular, to a capacitive acceleration sensor with a bending elastic beam and a preparation method thereof Description of Related Arts MEMS is defined as micro-electro-mechanical systems, which consists of multiple micro mechanism, micro sensors, micro actuators and signal processing, control circuits, communication interfaces, and power supply. This technology originated in microelectronics technology, further widens and extends in the mechanical or mechatronics field. So far, MEMS device mainly includes micro sensors with high accuracy, high efficiency, high reliability and low cost, which are widely used in the fields of information, automotive, medical science, aerospace, defense and the like.

In MEMS sensors, a micro acceleration sensor is an important inertial sensor, and is used as a test device to convert the physical signal of acceleration into an electrical signal to facilitate the measurement. According to different detection methods, MEMS acceleration sensors can be divided into capacitive type, piezoresistive type, piezoelectric type, surface acoustic wave type, tunnel type and the like. Therein a capacitive acceleration sensor with the advantages of high precision, little influence by temperature changes, etc., becomes one of the most widely used acceleration sensors. A capacitive acceleration sensor is provided with a fixed electrode and a movable electrode on a seismic mass, when the mass is displaced by acceleration, the distance between the movable electrode and the fixed electrodes is changed, thereby causing the capacitance value between them to be changed. Via a CN conversion circuit, it is possible to detect the displacement of the seismic mass. Therein, since variable gap is used in a differential force balance acceleration sensor, the micro acceleration sensor may have the advantages of simple structure, fast dynamic response, and enable to achieve non-contact measurement, good sensitivity, high resolution, and the measurement of micro displacements.

A sandwich capacitive acceleration sensor can achieve higher detection accuracy, and the method for preparing the sandwich capacitive acceleration sensors is mainly the method of bulk silicon micro-mechanical machining. In order to improve the detection sensitivity of micro acceleration sensor, various research institutions and companies have provided a variety of methods. Specifically, the methods include increasing the mass of a sensitive seismic mass, controlling the thickness of a cantilever, and using a full symmetrical differential structure.

For example, W. S. Henrion et al. employ a double layer bonded silicon beam method to form a beam-mass structure whose double sides are parallel and symmetrical (cf. Sensors structure with L-shaped spring legs, U.S. Pat. No. 5,652,384), the process thereof may employ a method combining KOH etching with dry deep etching releasing. Namely: firstly, KOH is used to etch the silicon wafer from the back to a thickness of the remaining beam, dry deep etching is then used to release the beam-mass structure from the front; two same beam-mass are further bonded back to back to achieve a dual-side structure. The process is complicated and the cost is comparatively high.

As another example, Gao et al. employ a SOI silicon wafer of the double device layer to prepare a middle layer, and prepare anti-overloading bumps on the upper and lower electrode plates, and then the sandwich structure is formed by performing a bonding process. The disadvantages of such method are that the dimension of sensor chip cannot be effectively used due to the big area occupied by L-shaped beams of the sensor; and the bonding process for preparing anti-overloading bumps on the upper and lower electrode plate is complicated.

As another example, H. Seidel et al. employ the concentrated boron-doped self-stop method (cf. Capacitive Silicon Accelerometer with Highly Symmetrical Design, Sensors and Actuators A: Physical, Vol. 21, pp. 312-315), to prepare the entirely symmetrical beam-mass structure, and during the process of KOH etching the beam-mass structure, the concentrated boron-doped layer serves as the etch stop to decide the thickness of the beam, and also serves as a mask in KOH etching in light doped regions. The disadvantages of such method are that nonuniformity of the doping concentration results in nonuniform thickness of the beam and that the residual stress generated in boron-doping process may affect the performance of the acceleration sensor, such as sensitivity and linearity, etc.

SUMMARY OF THE PRESENT INVENTION

In view of the abovementioned disadvantages in the prior art, the object of the present invention is to provide a capacitive acceleration sensor with bending elastic beams.

Another object of the present invention is to provide a method for preparing a capacitive acceleration sensor with a bending elastic beam, so as to prepare capacitive micro acceleration sensors with different measuring ranges and different sensitivities.

In order to achieve the abovementioned objects or other related objects, the present invention provides a method for preparing a capacitive acceleration sensor with a bending elastic beam, at least including:

1) performing etching at two surfaces of a SOI substrate having a double device layer based on an anisotropic etching method, causing the two surfaces to be concave, respectively;

2) forming a plurality of anti-overloading bumps at recesses on the two surfaces based on photolithography and the anisotropic etching method, respectively;

3) further forming damping grooves at the two surfaces of the structure on which the anti-overloading bumps have been formed based on photolithography and the anisotropic etching method, respectively;

4) performing etching on the two surfaces of the structure on which the damping grooves have been formed, respectively, based on photolithography and dry etching, and etching self-stops at a buried oxide layer, whereby on the two surfaces is formed a structure where the frame and the seismic mass are connected to the bending elastic beam, respectively, and the anti-overloading bumps and the damping grooves are caused to be positioned on the corresponding seismic mass, and the bending elastic beams of the two surfaces are staggered distributed and are not overlapped with each other in space;

5) releasing the bending elastic beam and the seismic mass based on photolithography, dry etching and the anisotropic etching method;

6) simultaneously bonding the first electrode structural layer, the structure comprising the released bending elastic beam and the seismic mass, and the second electrode structural layer based on a bonding process;

7) forming electrode lead via holes at the first electrode structural layer and the second electrode structural layer of the bonded structure based on infrared aligning; and 8) preparing an electrode on the structure on which the via holes have been formed.

Preferably, the dry etching is inductively coupled plasma etching or deep reactive ion etching.

Preferably, the photolithography is performed along <110> crystal orientation.

Preferably, the depth of the recess formed in step 1) does not exceed 3 μm.

Preferably, the height of the anti-overloading bumps does not exceed 1 μm.

Preferably, there are bending elastic beams connected at each of four sides of the seismic mass.

Preferably, the width B of the damping groove satisfies the requirement therebetween: $B<\sqrt{2}H$, where H is the thickness of a silicon layer of the oxygen containing silicon substrate which is used as the device layer.

The present invention further provides a capacitive acceleration sensor with a bending elastic beam, at least including:

a first electrode structural layer, a middle structural layer and a second electrode structural layer;

wherein the first electrode structural layer and the second electrode structural layer are provided with an electrode lead via holes, respectively;

the middle structural layer includes: a frame formed at an oxygen containing silicon substrate having a double device layer, a seismic mass whose double sides are symmetrical, and a bending elastic beam with one end connected to the frame and the other end connected to the seismic mass, wherein there are anti-overloading bumps and damping grooves symmetrically provided on the two sides of the seismic mass, and the bending elastic beams positioned in the different planes are staggered distributed and are not overlapped with each other in space;

As mentioned above, the capacitive acceleration sensor with a bending elastic beam and the preparation method of the present invention have the following beneficial effects:

1. Since the bending elastic beams on the upper and lower sides of a movable seismic mass are staggered distributed, and are not overlapped with each other in space, and are intersected at 90°, and an initial bending elastic beam structure is formed by inductively coupled plasma etching or deep reactive ion etching, the shape of the elastic beam has stronger process compatibility, and the structure dimension of the sensor can be effectively reduced.

2. By the beam structure distributed in eight corners of the movable seismic mass, it can be ensured that the seismic mass has a rectangle structure without using a convex corner compensation structure, so that after anisotropic etching, the expected structure of the device can be completed remained without damage, and the structure designing can be simplified.

3. The anti-overloading bumps are fabricated directly on the surface of the seismic mass, instead of fabricating the anti-overloading bumps on the electrode plate, which may simplify the bonding process.

4. The width of the damping groove is controlled to form V-shaped damping grooves by etch-stop technology.

5. The silicon oxide layer of the SOI buried layer serves as the etch stop layer releasing the beam structure, such that the thickness of the bending elastic beam structure is accurate and controllable.

6. Three layers of silicon wafers are bonded at one time, instead of first bonding the middle structural layer and the first electrode structural layer, and then bonding with the second electrode structural layer, so the process is even simpler.

7 Infrared photolithography alignment is carried out on the middle electrode lead via hole pattern after completing three layer bonding, omitting the complicated technological process of bonding prealignment.

8. The movable electrodes in the middle of the SOI silicon wafer with the double device layer are led from the upper and lower device layers of the SOI silicon wafer, respectively, and the device layers which are isolated from one another in the SOI silicon wafer are conducted via peripheral connection.

DESCRIPTION OF THE NUMBERS OF THE ELEMENTS

Figure 1A:
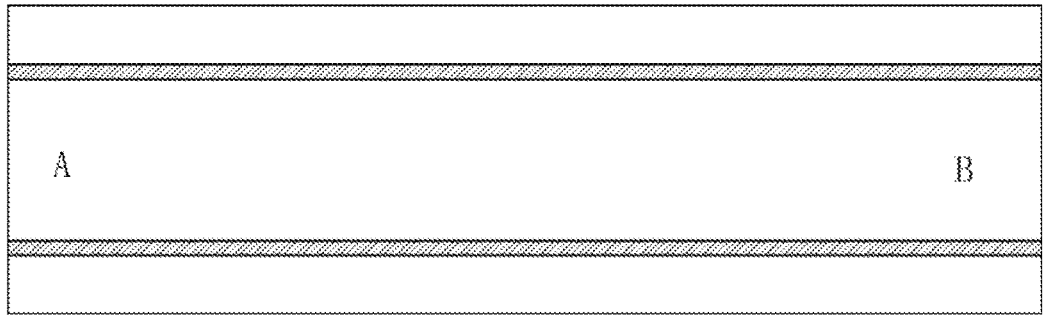
FIGS. 1a-1l are flow chat of a method for preparing a capacitive acceleration sensor with a bending elastic beam of the present invention.

1 First electrode structural layer
2 Middle structural layer
3 Second electrode structural layer
4 Seismic mass
5 Anti-overloading bumps
6 Middle electrode
7 Damping groove
8 Bending elastic beam
9 Electrode lead via hole
10 Capacitive gap

DETAILED DESCRIPTION OF THE PREFERRED EMBODIMENTS

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Please refer to FIG. 1a to FIG. 2d. It is to be noted that the drawings provided in the present embodiment only explain the basic conception of the present invention in an illustrative manner, so the drawings only display the components relevant to the present invention rather than being drawn according to the number, shape and size of the components during actual implementation, the shape, number and scale of each component may be randomly changed during its actual implementation, and the layout of the components thereof might also be more complicated.

The method for preparing a capacitive acceleration sensor with a bending elastic beam of the present invention includes the following steps:

1. The fabrication of a middle structural layer, i.e., a bending elastic beam-mass structural wafer:

(1) Taking the SOI silicon wafer with a double device layer as a substrate, as illustrated in FIG. 1a.

Figure 1B:
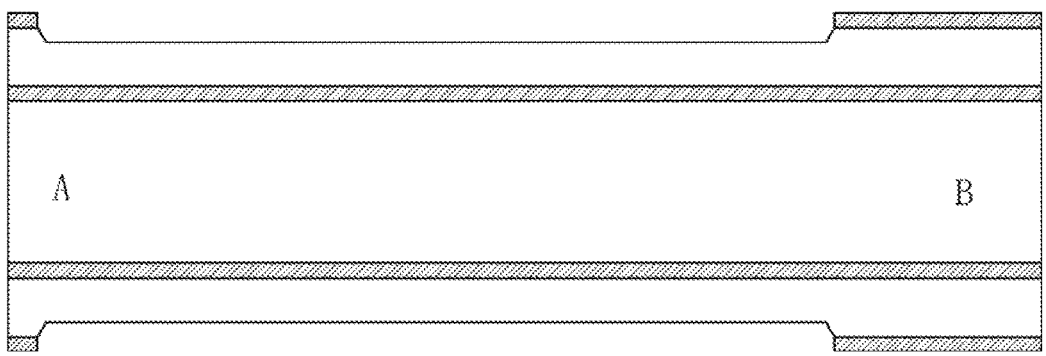

(2) After the silicon substrate is subjected to an oxidation process, creating a KOH etching window through photolithography and etching by a BOE etching solution, and then utilizing a KOH anisotropic etching method on the upper and lower surfaces of the silicon substrate to cause the two surfaces to be concave, respectively, so as to be capable of having a capacitive gap when bonded with the first electrode structural layer and the second electrode structural layer subsequently, wherein the etching depth is 1 µm, as illustrated in FIG. 1b.

Figure 1C:
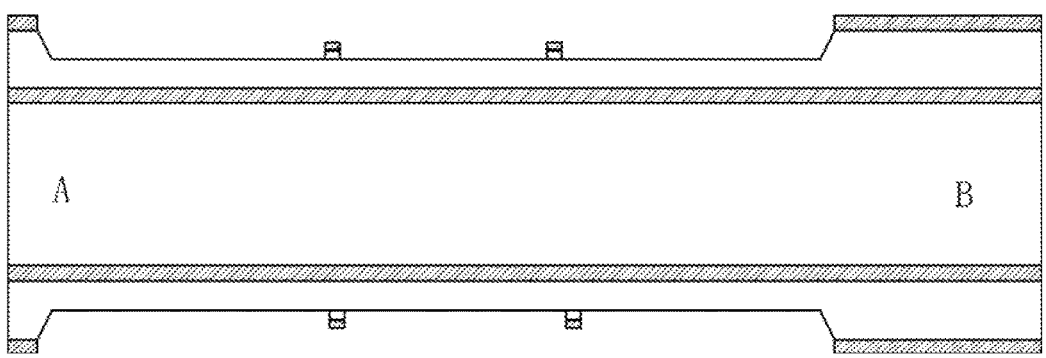

(3) Removing the protection layer of the silicon oxide layer of the remaining area of the silicon substrate which has been concave, and performing oxidation again to form a silicon oxide protection layer, subsequently creating a KOH etching window through photolithography and etching by a BOE etching solution, and fabricating anti-overloading bumps on the upper and lower surfaces of the silicon substrate through an anisotropic etching method, wherein the height of the anti-overloading bumps is 1 µm, as illustrated in FIG. 1c.

Figure 1D:
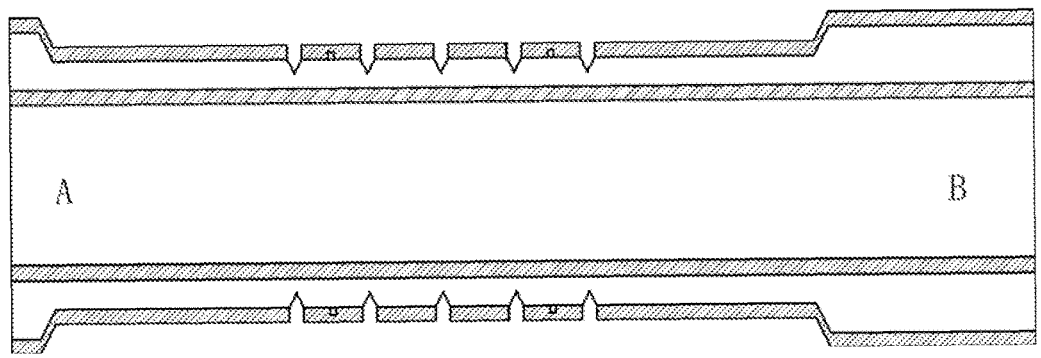

(4) Removing the protection layer of the silicon oxide layer of the remaining area of the structure where the anti-overloading bumps have been formed, performing oxidation again to form silicon oxide, creating a KOH etching window through photolithography and etching by a BOE etching solution, forming damping grooves by etching at the upper and lower surfaces of the silicon substrate using a potassium hydroxide anisotropic etching method, and forming V-shaped grooves by etch-stop, as illustrated in FIG. 1d.

Preferably, when creating a KOH etching window through etching by a BOE etching solution, the width of the KOH etching window depends on the silicon layer of the oxygen containing silicon substrate that is used as the device layer, whereby the width B of the damping groove as formed and the thickness H of the silicon layer satisfy the requirement therebetween: $B<\sqrt{2}H$.

Figure 1E:
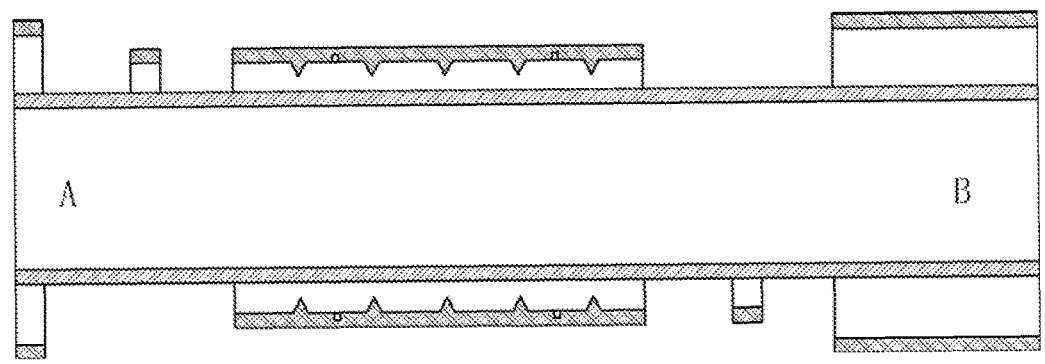

(5) Removing the oxide layer of the remaining area of the structure where the damping grooves have been formed, performing double-sided photolithography, taking photoresist as a masking layer, applying ICP or DRIE dry etching to form a structure where the frame and the seismic mass are connected to the bending elastic beam, respectively, and causing the anti-overloading bumps and the damping grooves to be positioned on the corresponding seismic mass, and the bending elastic beams of the two surfaces are staggered distributed and are not overlapped with each other in space, as illustrated in FIG. 1e, wherein the frame serves as an anchor zone of the seismic mass.

Figure 1F:
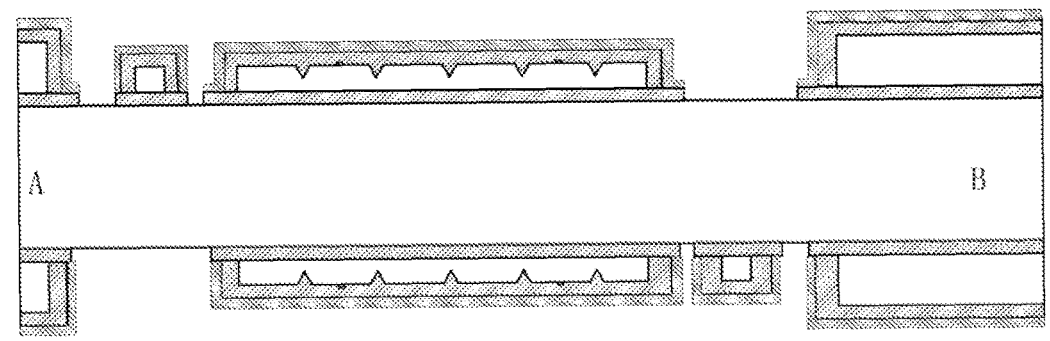

(6) Removing the photoresist protective layer, further oxidizing the silicon substrate, then performing double-sided photolithography, and creating a KOH etching window by etching with a BOE etching solution, as illustrated in FIG. 1f.

Figure 1G:
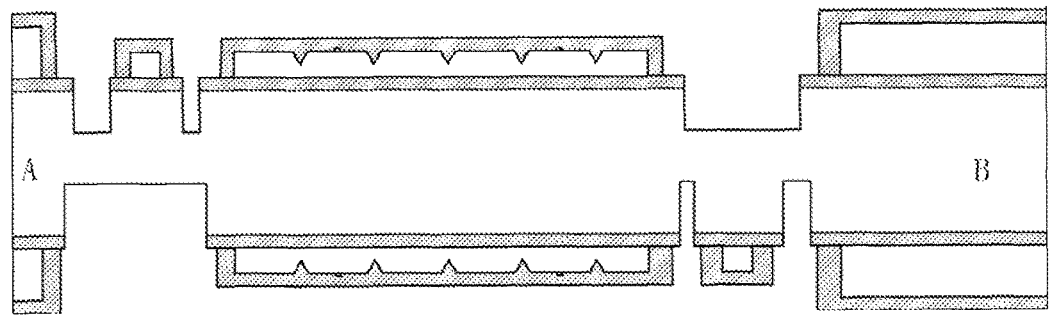

(7) After creating the etching window, continuously using the photoresist in the process of the previous step as a protection layer for ICP or DRIE dry etching, and etching the bulk silicon layer of the SOI silicon substrate, wherein the etching depth should guarantee that the entirely symmetrical bending elastic beam and the seismic mass can finally be released through anisotropic etching, as illustrated in FIG. 1g.

Figure 1H:
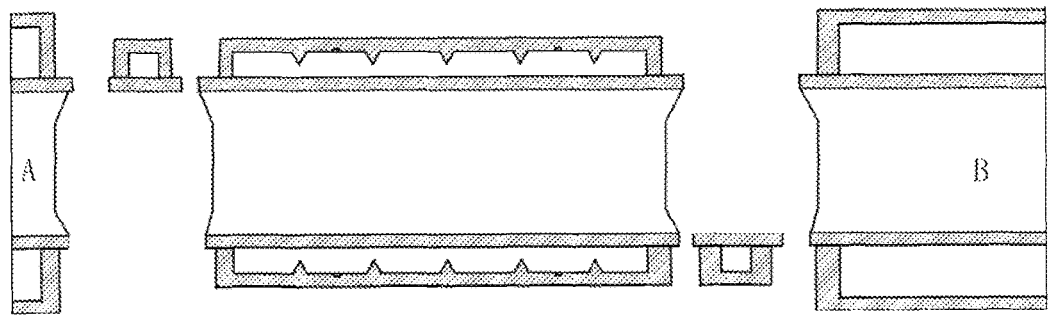

(8) Performing silicon substrate etching using an anisotropic etching method until the bending elastic beam and the seismic mass are released. When the bending elastic beam structure is finished by etching, the buried oxide layer in the double device SOI silicon wafer serves as the etch stop layer, realizing self-stop of the etching process of the beam, as illustrated in FIG. 1h.

Figure 1I:
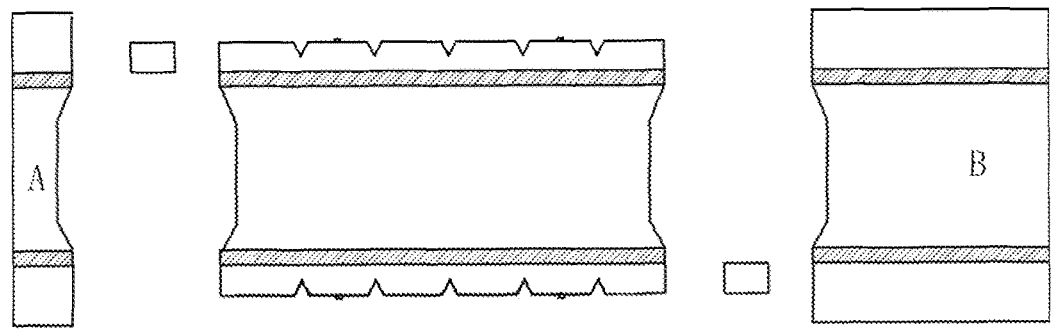

(9) Removing the silicon oxide layer for etching and masking in the remaining area to obtain a bending elastic beam-mass structure of the middle structural layer, as illustrated in FIG. 1i.

2. The first electrode structural layer and the second electrode structural layer are formed by preparing a silicon oxide insulating layer through thermal oxidization of a direct double-sided polished silicon wafer, respectively.

Figure 1J:
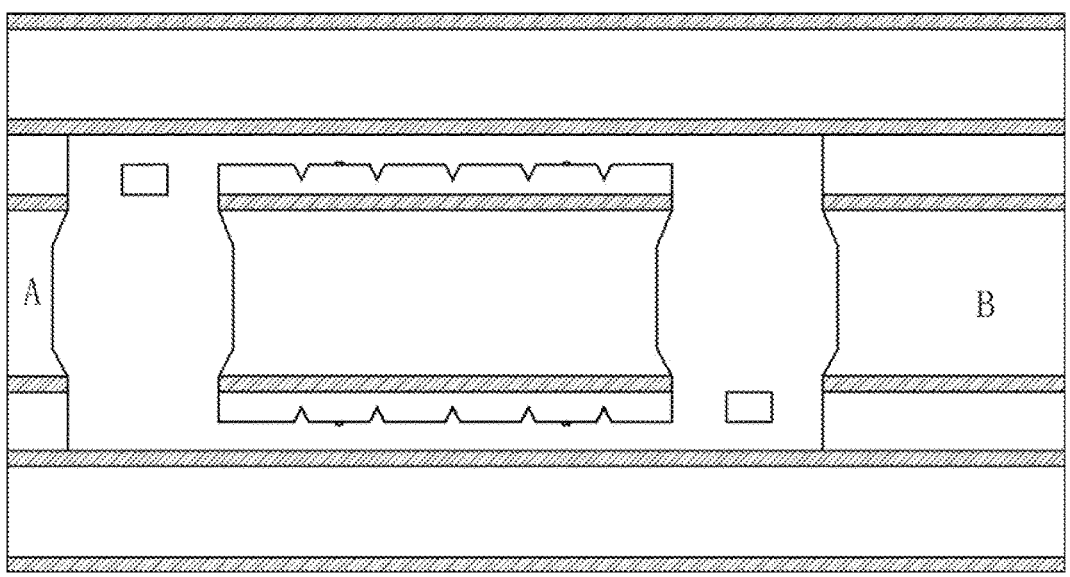
Figure 1K:
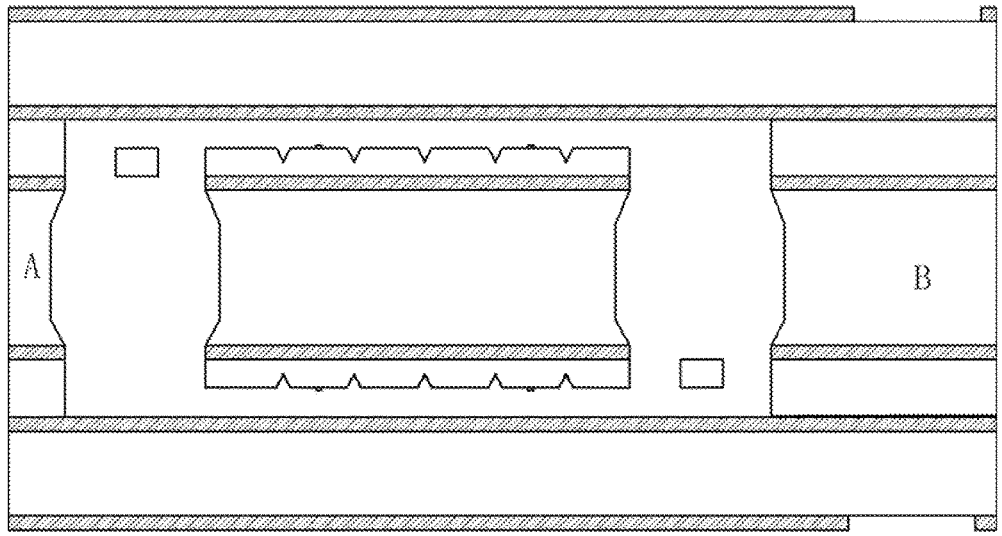

3. Through a simultaneous bonding process of the three layers, the first electrode structural layer, the middle structural layer and the second electrode structural layer are bonded together, as illustrated in FIG. 1j.

4. A middle electrode lead via-hole etching window is fabricated at the upper and lower surfaces of the bonded structure through infrared alignment photolithography, as illustrated in FIG. 4k.

Figure 1L:
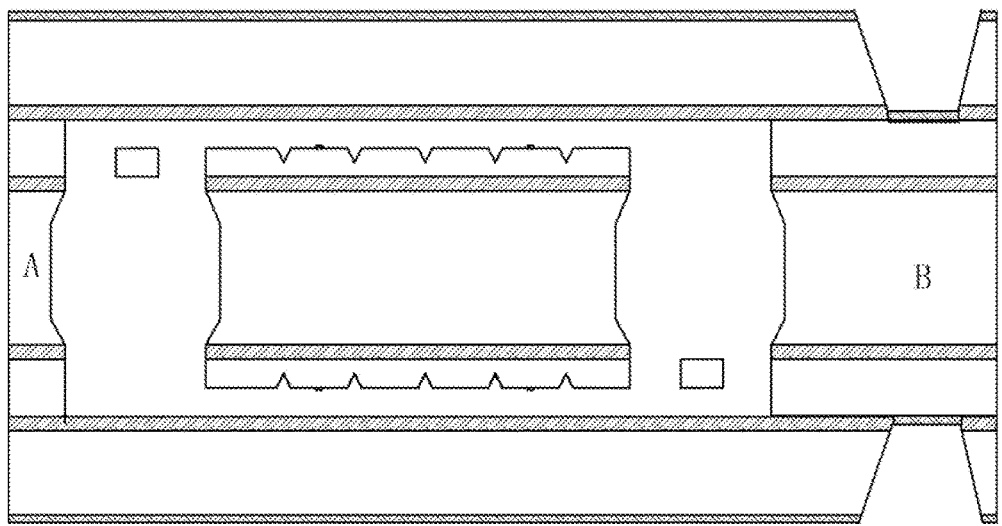

5. Anisotropic etching of silicon is performed to form electrode lead via-holes of the middle electrodes of the movable seismic mass, and subsequently the fabrication of the electrode lead of the bonded structure is performed, i.e., a metal layer is fabricated at the front and back sides of the bonded structure by sputtering, evaporation and the like, wherein the materials of the metal layer include, but not limited to, Al, Au, Ni, and the like, as illustrated in FIG. 1l.

Figure 2A:
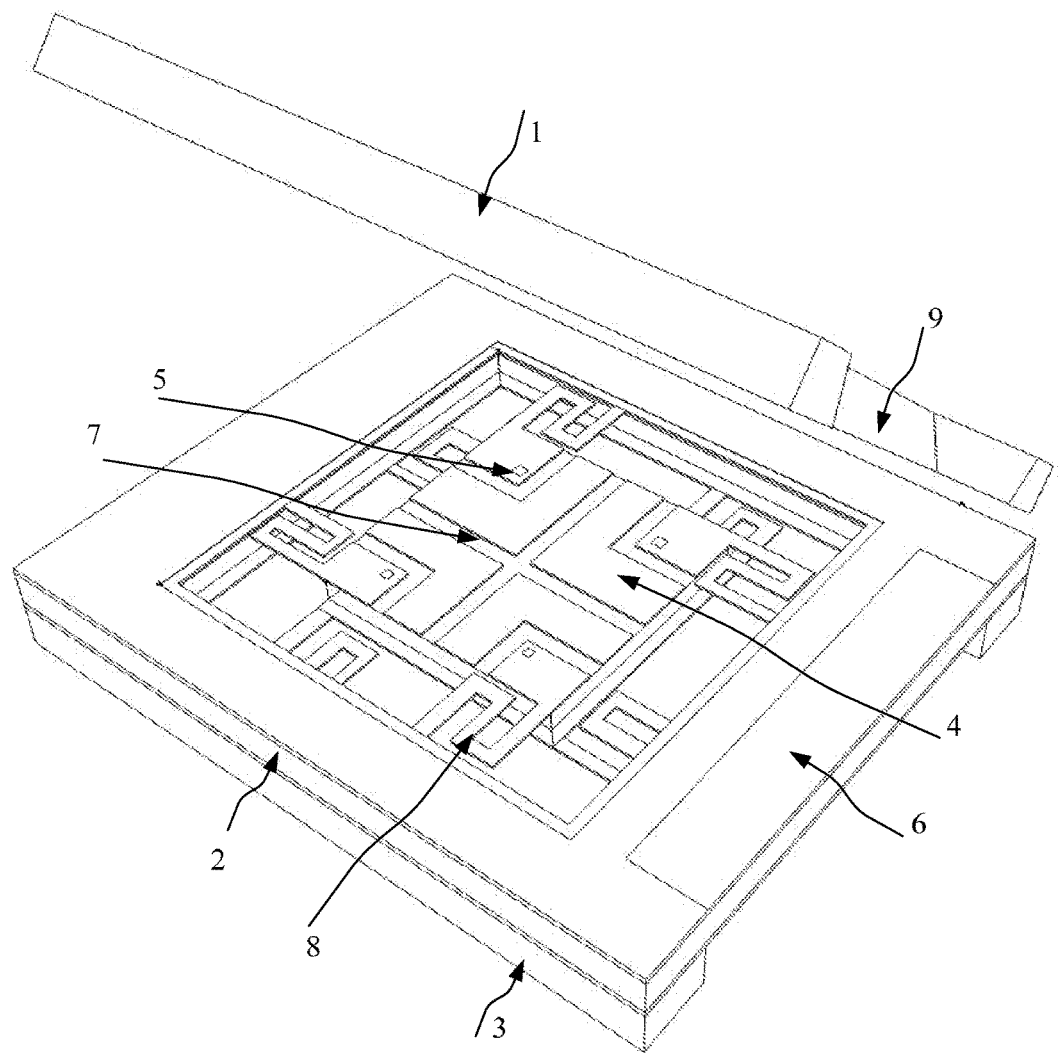
FIG. 2a is a stereogram of a capacitive acceleration sensor with a bending elastic beam of the present invention.
Figure 2B:
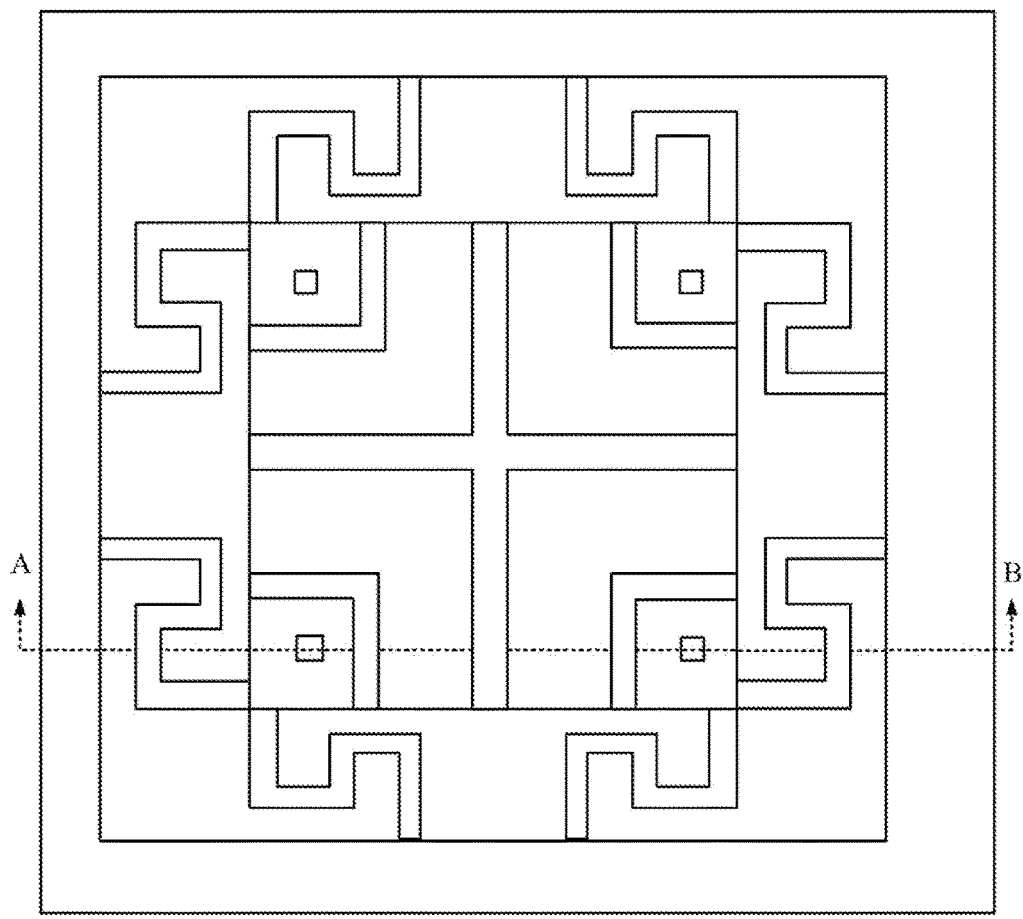
FIG. 2b is a vertical view of a middle structural layer of a capacitive acceleration sensor with a bending elastic beam of the present invention.
Figure 2C:
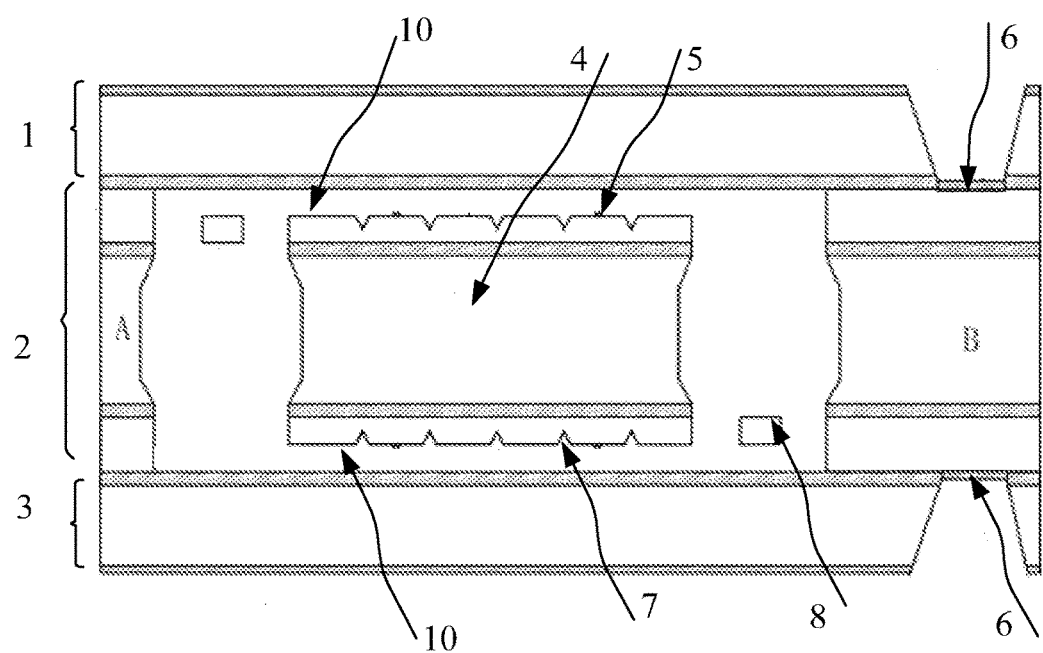
FIG. 2c is an A-B oriented sectional view of a middle structural layer of a capacitive acceleration sensor with a bending elastic beam of the present invention.

Through the foregoing steps, a capacitive acceleration sensor with bending elastic beams as formed is prepared as illustrated in FIGS. 2a to 2c, the capacitive acceleration sensor at least includes: a first electrode structural layer 1, a middle structural layer 2 and a second electrode structural layer 3.

Therein, the first electrode structural layer 1 and the second electrode structural layer 2 are provided with an electrode lead via-hole 9, respectively, and there are capacitive gaps 10 between the first electrode structural layer 1 and the middle structural layer 2, and between the second electrode structural layer 2 and the middle structural layer 2, the capacitive gap 10 is formed because the abovementioned silicon substrate is concave.

Therein, the middle structural layer 2 includes: a frame formed on an oxygen containing silicon substrate with a double device layer, a seismic mass 4 whose double sides are symmetrical, and a bending elastic beam 8 with one end connected to the frame and the other end connected to the seismic mass 4. Therein, A middle electrode 6 is formed at a part of the frame that correspond to the electrode lead via-hole 9, anti-overloading bumps 5 and damping grooves 7 are symmetrically provided on two sides of the seismic mass, respectively, the four sides of each face thereof are connected to bending elastic beams 8, and the bending elastic beams at different planes are staggered distributed and are not overlapped with each other in space.

Besides, preferably, since the capacitive acceleration sensor for the bending elastic beam has a tiny structure (micron dimension) and is etched by anisotropic etching of silicon, the photolithography is performed strictly along <110> crystal orientation, which can effectively guarantee a rectangular seismic mass.

Moreover, the bending times of the bending elastic beam, the total length and the total width of the beam are determined by sensitivity and the like.

Figure 3:
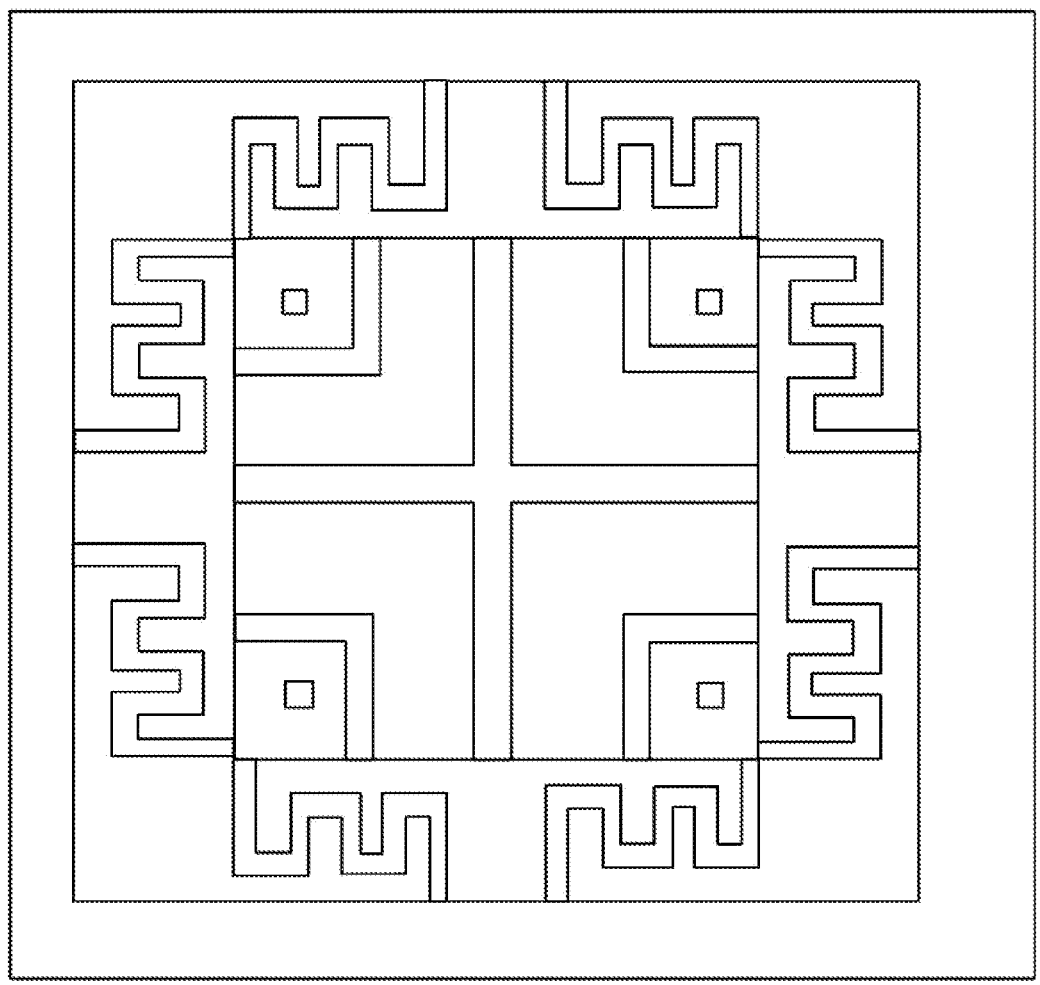
FIG. 3 is another preferred vertical view of a middle structural layer of a capacitive acceleration sensor with a bending elastic beam of the present invention.

For example, as shown in FIG. 3, the bending times of the bending elastic beam of the capacitive acceleration sensor is more than that of the bending elastic beam shown in FIG. 2b.

In summary, the method for preparing a capacitive acceleration sensor of a bending elastic beam of the present invention, as compared with the existing preparation method, has simple fabricating process, and can simultaneously accomplish the fabrication of the beam and the seismic mass structure; moreover, since the seismic mass are connected by the bending elastic beams with staggered distribution, the performance of the acceleration sensor is stable, and bending elastic beams with different bending times, different total length and total width can be prepared as needed, so as to vary the sensitivity of the sensor, thus achieving greater flexibility. Therefore, the present invention effectively overcomes all kinds of disadvantages in the prior art and has highly industrial utilization values The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. A method for preparing a capacitive acceleration sensor with a bending elastic beam, at least including:
    1) performing etching at two surfaces of a SOI silicon substrate with a double device layer based on an anisotropic etching method, causing the two surfaces to be concave respectively;
    2) forming a plurality of anti-overloading bumps at recesses on the two surfaces based on photolithography and the anisotropic etching method, respectively;
    3) further forming damping grooves at the two surfaces of the structure on which the anti-overloading bumps have been formed based on photolithography and the anisotropic etching method, respectively;
    4) performing etching on the two surfaces of the structure on which the damping grooves have been formed, respectively, based on photolithography and dry etching, and etching self-stops at a buried oxide layer, whereby on the two surfaces is formed a structure where the frame and the seismic mass are connected to the bending elastic beam, respectively, and the anti-overloading bumps and the damping grooves are caused to be positioned on the corresponding seismic mass, and the bending elastic beams of the two surfaces are staggered distributed and are not overlapped with each other in space;
    5) releasing the bending elastic beam and the seismic mass based on photolithography, dry etching and the anisotropic etching method;
    6) simultaneously bonding the first electrode structural layer, the structure comprising the released bending elastic beam and the seismic mass, and the second electrode structural layer based on a bonding process;
    7) forming electrode lead via-holes at the first electrode structural layer and the second electrode structural layer of the bonded structure based on infrared aligning; and
    8) preparing an electrode on the structure on which the via-holes have been formed.

2. The method for preparing a capacitive acceleration sensor with a bending elastic beam according to claim 1, wherein the dry etching is inductively coupled plasma etching or deep reactive ion etching.

3. The method for preparing a capacitive acceleration sensor with a bending elastic beam according to claim 1, wherein the photolithography is performed along <110 > crystal orientation.

4. The method for preparing a capacitive acceleration sensor with a bending elastic beam according to claim 1, wherein the depth of the recess formed in step 1) does not exceed 3 µm.

5. The method for preparing a capacitive acceleration sensor with a bending elastic beam according to claim 1, wherein the height of the anti-overloading bumps does not exceed 1 µm.

6. The method for preparing a capacitive acceleration sensor with a bending elastic beam according to claim 1, wherein there are bending elastic beams connected at each of four sides of the seismic mass.

7. The method for preparing a capacitive acceleration sensor with a bending elastic beam according to claim 6, wherein the width B of the damping groove satisfies the requirement therebetween: $B<\sqrt{2}H$, where H is the thickness of a silicon layer of the oxygen containing silicon substrate which is used as the device layer.

8. A capacitive acceleration sensor with a bending elastic beam, at least including:
    a first electrode structural layer, a middle structural layer and a second electrode structural layer;
    therein the first electrode structural layer and the second electrode structural layer are provided with an electrode lead via-hole, respectively;
    the middle structural layer includes a frame formed on an oxygen containing silicon substrate with a double device layers, a seismic mass whose double sides are symmetrical and a bending elastic beam with one end connected to the frame and the other end connected to the seismic mass, therein anti-overloading bumps and damping grooves are symmetrically provided on two sides of the seismic mass, and the bending elastic beams at different planes are staggered distributed and are not overlapped with each other in space.

9. The capacitive acceleration sensor with a bending elastic beam according to claim 8, wherein each of four sides of the seismic mass is connected to the bending elastic beam.

10. The capacitive acceleration sensor with a bending elastic beam according to claim 8, wherein the width B of the damping groove requirement therebetween: $B<\sqrt{2}H$, where H is the thickness of a silicon layer of the oxygen containing silicon substrate which is used as the device layer.

\* \* \* \* \*